(12) United States Patent
Yoshitani et al.

(10) Patent No.: US 11,429,208 B2
(45) Date of Patent: Aug. 30, 2022

(54) DISPLAY DEVICE

(71) Applicant: Valeo Japan Co., Ltd., Saitama (JP)

(72) Inventors: Tomoyuki Yoshitani, Tokyo (JP); Tatsuo Nakaya, Tokyo (JP)

(73) Assignee: VALEO JAPAN CO., LTD.

( * ) Notice: Subject to any disclaimer, the term of this patent is extended or adjusted under 35 U.S.C. 154(b) by 0 days.

(21) Appl. No.: 16/952,073

(22) Filed: Nov. 18, 2020

(65) Prior Publication Data
US 2021/0149506 A1 May 20, 2021

(30) Foreign Application Priority Data

Nov. 19, 2019 (JP) .............................. JP2019-208461

(51) Int. Cl.
*G06F 3/01* (2006.01)
*G06F 3/0354* (2013.01)
*G06F 3/041* (2006.01)
*G06F 3/044* (2006.01)
*G02F 1/1333* (2006.01)

(52) U.S. Cl.
CPC ...... *G06F 3/03547* (2013.01); *G02F 1/13338* (2013.01); *G06F 3/016* (2013.01); *G06F 3/0412* (2013.01); *G06F 3/0445* (2019.05)

(58) Field of Classification Search
CPC .. G06F 3/03547; G06F 3/0412; G06F 3/0445; G06F 3/016; G06F 1/1626; B60K 37/02; B60K 37/06; B60K 2370/91; B60K 2370/1438; B60K 2370/158; B60K 2370/21; B60K 2370/741; H03K 17/975; H03K 17/962; H03K 2217/96062; H03K 2217/96054; H03K 2217/9651
See application file for complete search history.

(56) References Cited

U.S. PATENT DOCUMENTS

2006/0250377 A1* 11/2006 Zadesky ............... G06F 3/0227
345/173
2013/0278560 A1* 10/2013 Yamaguchi ........... G06F 3/0445
345/174
(Continued)

FOREIGN PATENT DOCUMENTS

JP         2015-41289 A        3/2015

OTHER PUBLICATIONS

English abstract for JP-2015-41289.

*Primary Examiner* — Ryan A Lubitz
(74) *Attorney, Agent, or Firm* — Fishman Stewart PLLC

(57) ABSTRACT

A display device may include a display part, a sensor, an actuator, and a control device. The display part may include an operation surface on which a touch operation is performed by a user. The sensor may detect a displacement of the display part by the touch operation. The actuator may be configured to vibrate the display part. The control device may be configured to vibrate the display part with the actuator when the displacement of the display part by the touch operation is detected. The display part may be displaceable between a restriction position for restricting the displacement of the display part via the actuator and an allowance position for allowing the displacement of the display part via the actuator. The control device may be further configured to adjust the display part into the allowance position when a user operation for the touch operation is detected.

6 Claims, 8 Drawing Sheets

(56) References Cited

U.S. PATENT DOCUMENTS

| | | | |
|---|---|---|---|
| 2019/0079583 A1* | 3/2019 | Alghooneh | G06F 1/1643 |
| 2019/0094970 A1* | 3/2019 | Van Ausdall | G06F 3/016 |
| 2019/0384396 A1* | 12/2019 | Cruz Hernandez | G05D 19/02 |
| 2020/0033946 A1* | 1/2020 | Chang | H01L 41/0477 |

* cited by examiner

Restriction Position

Allowance Position

DISPLAY DEVICE

CROSS-REFERENCE TO RELATED APPLICATION

This application claims priority under 35 USC 119 from Japanese Patent Application No. JP-2019-208461 filed on Nov. 19, 2019, the disclosure of which is incorporated by reference herein.

TECHNICAL FIELD

The present invention relates to a display device.

BACKGROUND

Japanese Patent Laid-Open No. 2015-41289 discloses a touch panel device (a display device) of a force feedback type in which when a touch panel is operated by an operator (a user), a display part including the touch panel is vibrated to inform the operator of detection of the operation on the side of the device.

This touch panel device adopts a supporting structure of the display part configured to facilitate vibrations of the display part.

However, the touch panel device is therein provided with a component susceptible to vibrations, such as a sensor for detecting a pressing operation of the touch panel.

In a case where the touch panel device is mounted on a vehicle or the like, vibrations due to travel of the vehicle regularly act on the touch panel device. Therefore, there is a possibility that the regularly acting vibration gives an effect to the component susceptible to the vibration within the touch panel.

Therefore, there is the need of making the effect of the vibration difficult to reach the component susceptible to the vibration in the display device of the force feedback type.

SUMMARY

Accordingly, the present invention is made in view of the above-described problem in the conventional technology, and an object of the present invention is to provide a display device that can appropriately suppress an effect of vibrations.

The present invention provides a display device comprising:

a display part with an operation surface on which a touch operation is performed by a user;

a sensor that detects a displacement of the display part by the touch operation;

an actuator that vibrates the display part; and a control device configured to control the actuator, the control device vibrating the display part by the actuator when the displacement of the display part by the touch operation is detected, wherein the display part is displaceable between a restriction position for restricting the displacement of the display part and an allowance position for allowing the displacement of the display part, by the actuator, and the control device is configured to hold the display part in the restriction position, and locate the display part in the allowance position when a user operation for the touch operation is detected.

According to the present invention, when the user operation for the touch operation is detected, in a case where the displacement of the display part is allowed and is not detected, the displacement of the display part is restricted.

Thereby, the component susceptible to vibrations in the display device can appropriately be suppressed from being intermittently subject to vibrations, which affects the component.

BRIEF DESCRIPTION OF THE DRAWINGS

Other objects, features, and advantages of the present invention will become more apparent from the following detailed description made with reference to the accompanying drawings, in which like parts are designated by like reference numbers and in which.

DETAILED DESCRIPTION

Hereinafter, an embodiment in the present invention will be explained by taking a case of a display device 1 (a touch panel device) that is mounted on a vehicle and is operated by a user as an example, with reference to the accompanying drawings.

Figure 1:
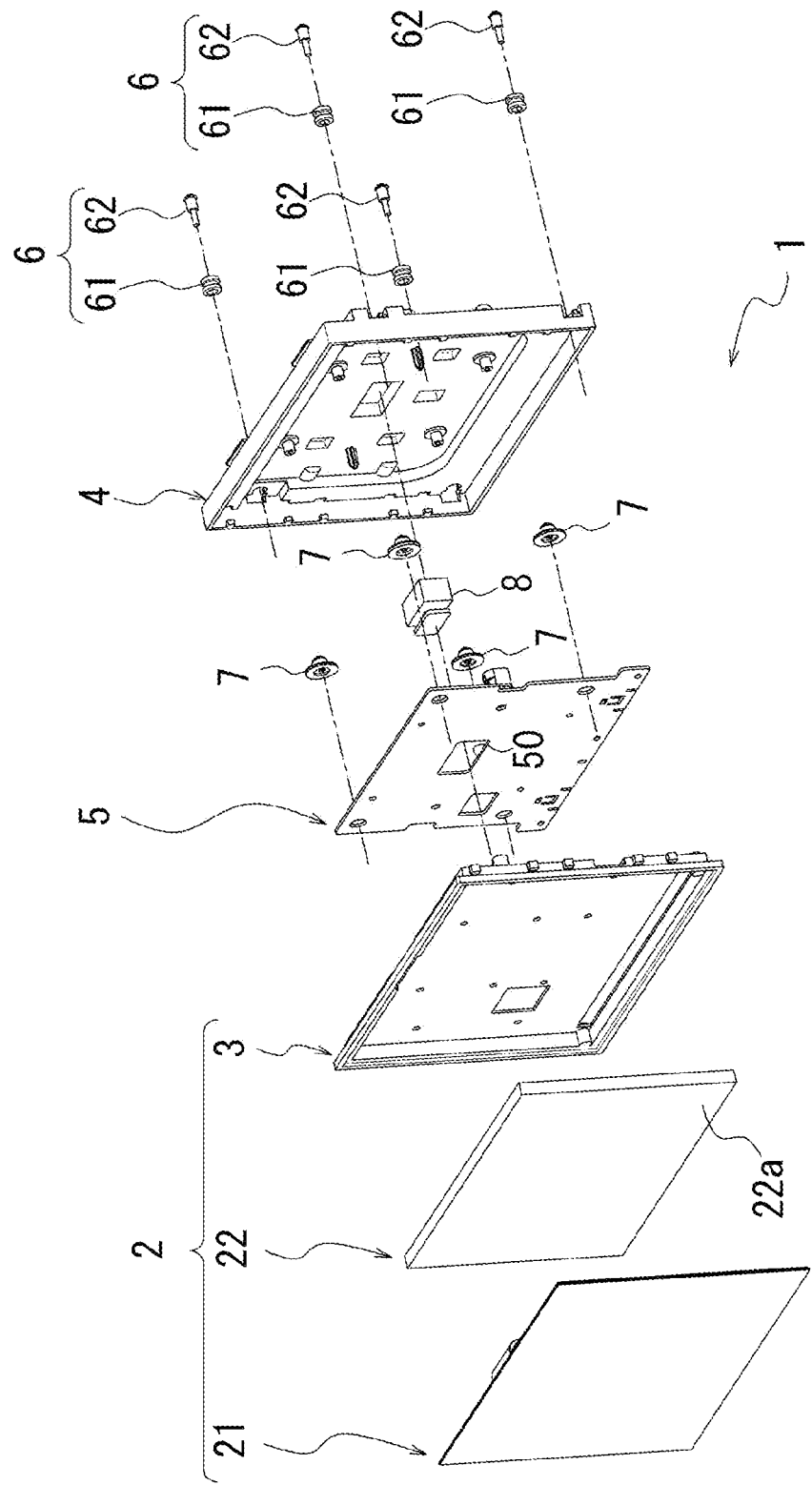
FIG. 1 is an exploded perspective view illustrating a display device according to an embodiment of the present invention.

FIG. 1 is an exploded perspective view illustrating the display device 1.

Figure 2A:
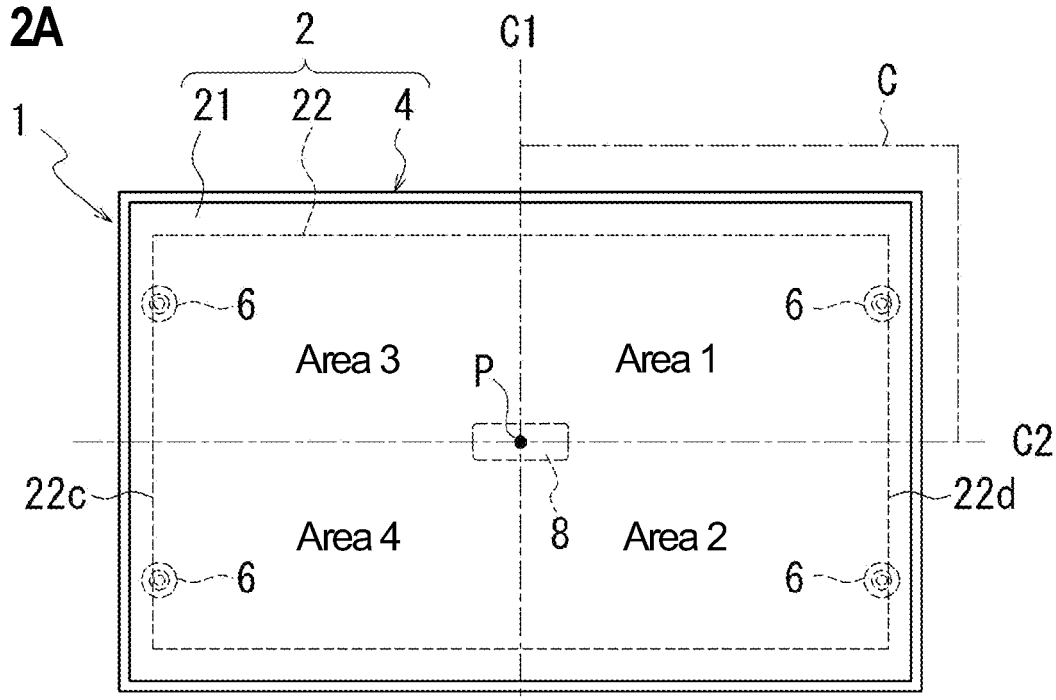
FIG. 2A is a front view illustrating the display device as viewed from a touch panel side according to the embodiment.

FIG. 2A is a front view illustrating the display device 1 as viewed from a touch panel 21-side, and a view illustrating in a broken line positions of a liquid crystal display panel 22, shock absorbers 6 and a solenoid 8 located on the back of the touch panel 21.

Figure 2B:
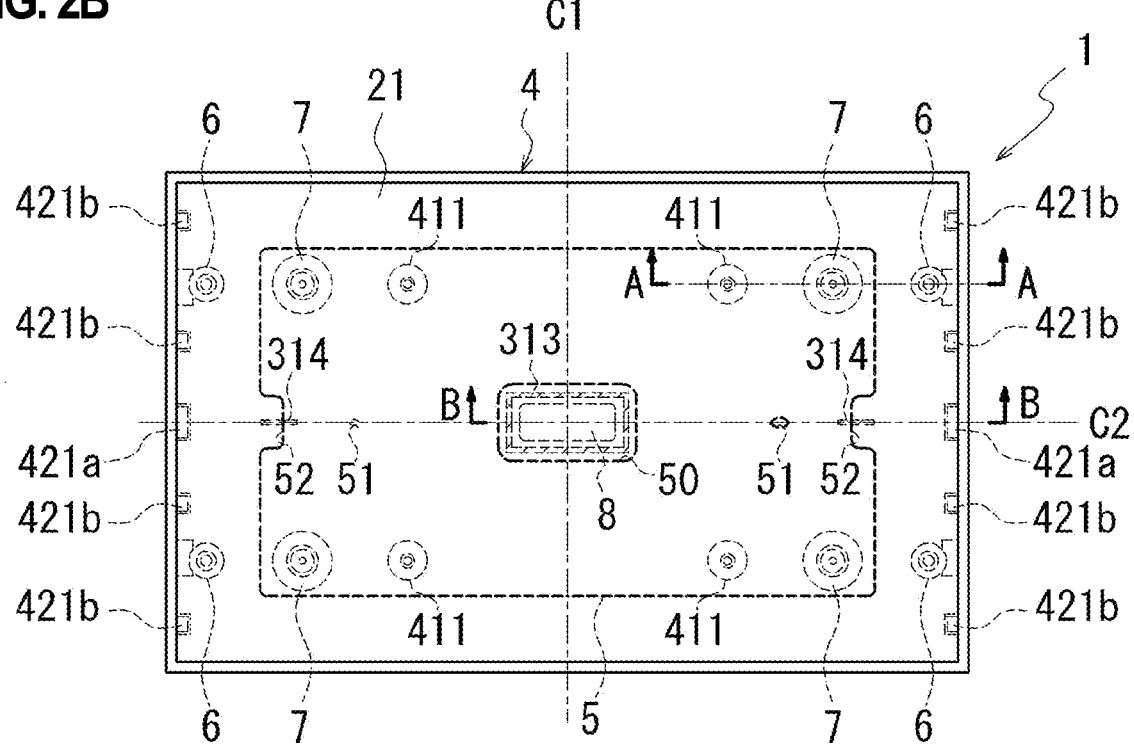
FIG. 2B is a front view illustrating in a broken line positions of main components located on the back of the touch panel according to the embodiment.

FIG. 2B is a view illustrating in a broken line positions of main components located on the back of the touch panel 21 in the display device 1.

As illustrated in FIG. 1, the display device 1 is provided with the touch panel 21, the liquid crystal display panel 22, a holder 3, a rear cover 4 and a print board 5.

A display part 2 according to the present invention is configured of the touch panel 21, the liquid crystal display panel 22 and the holder 3. The display part 2 is supported by the rear cover 4 covering the back surface of the display part 2 to be displaceable in a thickness direction of the display part 2.

The touch panel 21 is a conventionally known touch panel by which an operation by a hand finger of a user can be detected. In a plan view, the touch panel 21 is formed in a rectangular shape and is as large as to cover the front surface of the liquid crystal display panel 22 (refer to FIG. 2A).

The liquid crystal display panel 22 is a conventionally known liquid crystal display panel such as a TFT liquid crystal. The liquid crystal display panel 22 is also formed in a rectangular shape in a plan view. The front surface of the liquid crystal display panel 22 is a display surface 22a of information (refer to FIG. 1) and the display surface 22a of the liquid crystal display panel 22 is covered with the touch panel 21.

Figure 3A:
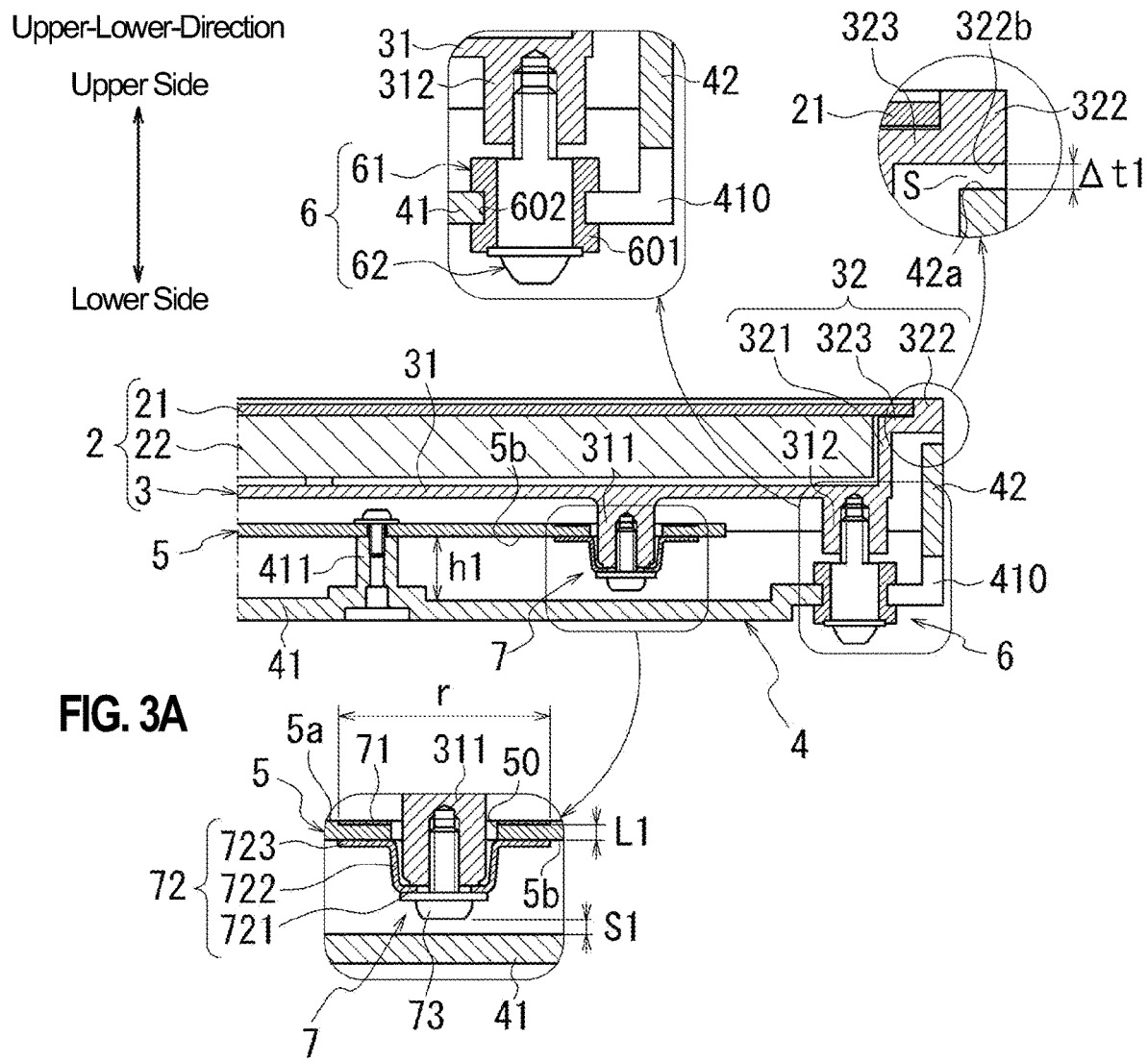
FIG. 3A is a cross section illustrating the display device, taken on line A-A in FIG. 2B according to the embodiment.
Figure 3B:
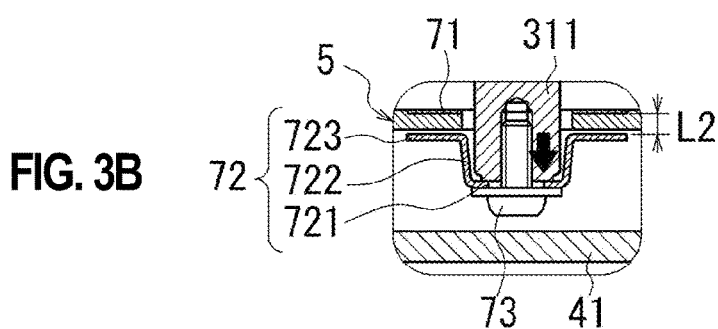
FIG. 3B is an explanatory diagram illustrating a displacement of a spacer in a sensor at the time the display part 2 is displaced according to the embodiment.

FIG. 3A is a cross section illustrating the display device 1 and is views schematically illustrating section A-A in FIG. 2B. FIG. 3B is a diagram explaining a displacement of a spacer 72 in a sensor 7 at the time the display part 2 is displaced.

Figure 4A:
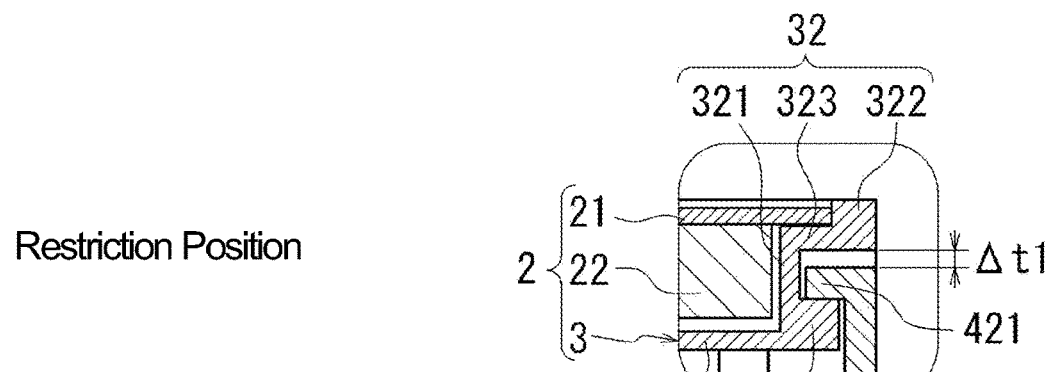
FIG. 4A is a cross section illustrating the display device, taken on line B-B in FIG. 2B according to the embodiment.
Figure 4A:
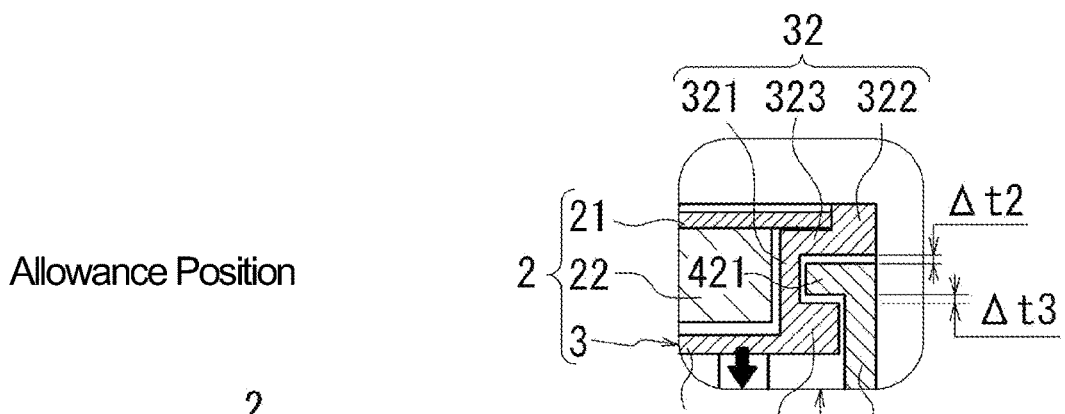
Figure 4B:
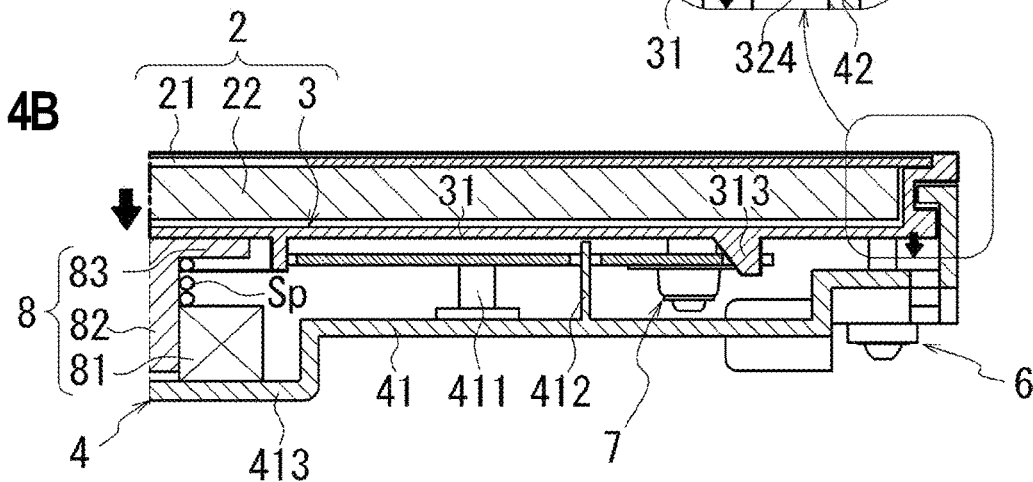
FIG. 4B is an explanatory diagram illustrating an arrangement of an engaging part and a locking part of the sensor at the time the display part 2 is displaced according to the embodiment.

FIG. 4A is a cross section illustrating the display device 1 and is views schematically illustrating section B-B in FIG. 2B. FIG. 4B is a diagram explaining an arrangement of an engaging part 324 and a locking part 421 in the sensor 7 at the time the display part 2 is displaced.

It should be noted that in the following explanation, a positional relation between components in the display device 1 will be explained on a basis of an upper-lower direction in FIG. 3A as needed.

As illustrated in FIG. 3A and FIG. 3B, the holder 3 is provided with a bottom wall part 31 that supports the back surface of the liquid crystal display panel 22, and a peripheral wall part 32 that surrounds an outer peripheral edge of the bottom wall part 31 over an entire periphery thereof.

The peripheral wall part 32 is provided with a frame part 321 that surrounds an outer periphery of the liquid crystal display panel 22, a decorative frame 322 that surrounds an outer periphery of the touch panel 21 and a support part 323 on which an outer peripheral edge of the touch panel 21 is seated.

In a plan view, the peripheral wall part 32 is formed in a rectangular shape. The decorative frame 322 is formed to have an opening diameter larger than the frame part 321.

The support part 323 is a connection part between the frame part 321 and the decorative frame 322. The support part 323 extends from a top end to an exterior of the frame part 321, and after that, is connected to a lower end of the decorative frame 322.

In the peripheral wall part 32 the support part 323 is disposed along an inner periphery of the decorative frame 322. The support part 323 is disposed inside of the decorative frame 322 over an approximately entire periphery thereof.

When the outer peripheral edge of the touch panel 21 is caused to be seated on the support part 323, the touch panel 21 is to be located inside of the decorative frame 322.

The frame part 321 of the holder 3 is inserted inside of a peripheral wall part 42 of the rear cover 4. The rear cover 4 is provided with a bottom wall part 41, and a peripheral wall part 42 that surrounds an outer periphery of the bottom wall part 41 over an entire periphery thereof. In a plan view, the rear cover 4 is formed in a rectangular shape.

The peripheral wall part 42 is formed in an outer shape fitting in the decorative frame 322 on the holder 3-side. When the display device 1 is viewed from the touch panel 21-side, the peripheral wall part 42 of the rear cover 4 is hidden on the back of the decorative frame 322 on the holder 3-side.

A top end 42a of the peripheral wall part 42 in the rear cover 4 faces a back surface 322b of the decorative frame 322 with a clearance S therebetween in an overlapping direction of the holder 3 and the rear cover 4 (in an upper-lower direction in FIG. 3A).

In a plan view, the rear cover 4 is provided with shock absorbers 6 on four corners of the bottom wall part 41 (refer to FIG. 2A and FIG. 3A).

The shock absorbers 6 are arranged in each of one side (the left side in the figure) and the other side (the right side in the figure) across a center line C1 of the liquid crystal display panel 22 in the width direction on a two-by-two basis.

The shock absorbers 6 on one side are arranged in a position overlapping one lateral edge 22c of the liquid crystal display panel 22 in the width direction. These shock absorbers 6 are arranged in a positional relationship to be symmetrical across a center line C2 of the liquid crystal display part 22 in the height direction (in the upper-lower direction in FIG. 2A).

The shock absorbers 6 on the other side are arranged in a position overlapping the other lateral edge 22d of the liquid crystal display panel 22 in the width direction. These shock absorbers 6 are arranged in a positional relationship to be symmetrical across the center line C2.

Here, the center line C2 is a straight line perpendicular to the above-mentioned center line C1 at the center of the liquid crystal display panel 22.

As illustrated in FIG. 3A, the shock absorber 6 is provided with a resilient member 61 fixed on the bottom wall part 41 of the rear cover 4, and a bolt 62 connecting the resilient member 61 and the holder 3.

The resilient member 61 is formed of a material excellent in a vibration absorbing property, such as rubber. The resilient member 61 is provided with a cylindrical base part 601, and a fitting groove 602 disposed on an outer periphery of the base part 601. The fitting groove 602 is disposed on the outer periphery of the base part 601 over an entire periphery thereof.

In the bottom wall part 41 of the rear cover 4, an opening part 410 is disposed on an area where the shock absorber 6 is disposed. The resilient member 61 of the shock absorber 6 is disposed in a section of the opening part 410 such that the bottom wall part 41 is internally fitted into the fitting groove 602 disposed on the outer periphery of the base part 601.

The bolt 62 penetrates inside of the cylindrical base part 601 from the outside of the rear cover 4 to the holder 3-side. The front end side of the bolt 62 is threaded into a leg part 312 disposed in the bottom wall part 31 of the holder 3.

As illustrated in FIG. 2A, in the display device 1 the shock absorber 6 is disposed in each of four areas 1 to 4 that are defined by the two center lines C1, C2. The shock absorber 6 is arranged in each of a right oblique upper area, a right oblique lower area, a left oblique upper area and a left oblique lower area one-by-one on a basis of a solenoid 8 (a crossing point P between the center line C1 and the center line C2).

The holder 3 is supported through a total of the four shock absorbers 6 by the rear cover 4. Therefore, the vibration of the display part 2 including the holder 3 is absorbed by the sections of the shock absorbers 6.

As illustrated in FIG. 2B, the sensor 7 is disposed on the center line C1-side as viewed from the shock absorber 6.

As illustrated in FIG. 3A, the sensor 7 is provided with an antenna 71 and the spacer 72.

The antenna 71 is disposed on a surface 5a of the print board 5 on the holder 3-side. A through hole 50 is formed in the print board 5 for insert of a support tube 311 on the holder 3-side.

As viewed from the holder 3-side, the antenna 71 is formed in a ring shape to surround the through hole 50.

The support tube 311 is formed to be integral with the bottom wall part 31 of the holder 3 and projects downward of the rear cover 4 to the direction of the bottom wall part 41-side.

The support tube 311 penetrates the insert hole 50 formed in the print board 5 to the direction of the bottom wall part 41-side of the rear cover 4.

The spacer 72 is fixed on a lower end of the support tube 311 by a bolt 73.

The spacer 72 is provided with a disc part 721 fixed on the lower end of the support tube 311, a peripheral wall part 722 surrounding an outer peripheral edge of the disc part 721 over an entire periphery thereof and a flange part 723.

The flange part 723 surrounds an end part of the peripheral wall part 722 on the print board 5-side (on the upper side in the figure) over an entire periphery thereof. As viewed from the print board 5-side, the flange part 723 is formed in a ring shape. The flange part 723 is formed with an outer diameter approximately fitting in an outer diameter r of the above-mentioned antenna 71.

In the sensor 7, the flange part 723 and the antenna 71 of the print board 5 are arranged to be spaced from each other in the thickness direction of the print board 5.

When the flange part 723 is located in a position coming in contact with a back surface 5b of the print board 5, the flange part 723 and the antenna 71 are arranged to be separated from each other by an interval L1 in the thickness direction of the print board 5.

In the display device 1, when the display part 2 is displaced downward of the rear cover 4 on the bottom wall part 41-side by an operation of the touch panel 21 by a user, the spacer 72 fixed on the support tube 311 is also displaced to the bottom wall part 41-side in association with the displacement of the display part 2.

Thereby, the interval between the antenna 71 and the flange part 723 in the thickness direction of the print board 5 is broadened to change an electrostatic capacitance to be detected by the sensor 7. Therefore, the displacement of the display part 2 is detected in a later-described control device 10.

It should be noted that in the present embodiment, at a point when the flange part 723 and the antenna 71 are separated from each other by an interval L2 in the thickness direction of the print board 5, the displacement of the display part 2 is to be detected by the control device 10.

The display device 1 is configured as follows such that, when the touch panel 21 is operated, the spacer 72 fixed by the bolt 73 is prevented from being incapable of being displaced due to interference with the bottom wall part 41 of the rear cover 4.

In a state where the flange part 723 of the spacer 72 is caused to be in contact with the back surface 5b of the print board 5, a clearance 51 larger than a displacement possible amount of the display part 2 is ensured between the bolt 73 fixing the spacer 72 and the bottom wall part 41 of the rear cover 4.

As illustrated in FIG. 2B, the sensors 7 are located on the four corners of the print board 5 in the present embodiment. In the display device 1, the sensors 7 are arranged on the four areas 1 to 4 respectively defined by the two center lines C1, C2.

Therefore, even when any area of the touch panel 21 corresponding to the four areas 1 to 4 is operated in the display device 1, the displacement of the display part 2 caused by the operation of the touch panel 21 can be detected.

Support tubes 411 are arranged on the center line C1-side as viewed from the sensors 7.

The support tubes 411 are formed to be integral with the bottom wall part 41 of the rear cover 4. The support tubes 411 are arranged for supporting the print board 5 by the rear cover 4.

A total of the four support tubes 411 are arranged on the rear cover 4, and each of the support tubes 411 is located on each of the four areas defined by the two center lines C1, C2.

As illustrated in FIG. 3A, the support tubes 411 project upward of the bottom wall part 41 of the rear cover 4 on the print board 5-side. Each of the support tubes 411 is formed with the same height h1.

The support tubes 411 abut on the back surface 5b of the print board 5, and the print board 5 is fixed on the support tubes 411 by screws.

As illustrated in FIG. 2B, the insert hole 50 is formed in the central part of the print board 5 to avoid the interference with the solenoid 8.

Further, positioning holes 51 and notch parts 52 are formed on the print board 5, and the insert hole 50, the positioning holes 51 and the notch parts 52 line up on the center line C2.

Ribs 314 formed to be integral with the bottom wall part 31 of the holder 3 are inserted in the notch parts 52. As illustrated in FIG. 2B, the notch parts 52 and the ribs 314 are located with a positional relationship to be symmetrical across the center line C1 of the display device 1 in the width direction.

The ribs 314, 314 restrict a relative movement between the print board 5 and the display part 2 in the width direction (in the left-right direction in the figure) of the display device 1.

As illustrated in FIG. 4A, positioning pins 412 formed to be integral with the bottom wall part 41 of the rear cover 4 are inserted in the positioning holes 51.

A surrounding wall 313 formed to be integral with the bottom wall part 31 of the holder 3 is inserted in the insert hole 50 of the print board 5.

An abutting part 83 of the solenoid 8 abuts on the back surface 31b surrounded by the surrounding wall 313 in the bottom wall part 31 of the holder 3. An area surrounded by the surrounding wall 313 corresponds to a central area in the present invention.

As illustrated in FIG. 4A, a recessed part 413 recessed in a direction away from the print board 5 is formed in the central part of the bottom wall part 41 in the rear cover 4. The solenoid 8 is installed in the recessed part 413.

The solenoid 8 has a shaft 82 that moves forward/backward by the switching of power supply/non-power supply to a coil 81.

The abutting part 83 in a rectangular shape is disposed in an end part of the shaft 82 on the print board 5-side.

In the solenoid 8, at the non-power supply time to the coil 81 the abutting part 83 is held in a position of abutting on the back surface 31b of the holder 3 over an entire surface thereof. Further, a spring Sp is inserted on an outer surface of the shaft 82, and the abutting part 83 abuts on the back surface 31b of the holder 3 by an urging force of the spring Sp as well.

Therefore, at the non-power supply time to the coil 81, a holding force by the solenoid 8 and the urging force of the spring Sp act on the holder 3 through the abutting part 83.

As illustrated in FIG. 4B, the peripheral wall part 32 of the holder 3 is provided with the engaging part 324 on an extension line of the bottom wall part 31.

The engaging part 324 extends laterally and is disposed in parallel to the above-mentioned support part 323. The engaging part 324 and the support part 323 are arranged to be spaced therebetween in the thickness direction of the display part 2 (in the upper-lower direction in the figure).

The peripheral wall part 42 positioned outside of the engaging part 324 is provided with the locking part 421 on an inner periphery of an area, which faces the frame part 321, of the peripheral wall part 42, the locking part 421 being inserted between the support part 323 and the engaging part 324.

As illustrated in FIG. 2B, in the display device 1 the locking parts 421 (locking parts 421a, 421b) are arranged on both sides thereof in the width direction (in the left-right direction in the figure).

The rear cover 4 is provided with the wide-width locking parts 421a arranged in positions intersecting with the above-mentioned center line C2 and the two locking parts 421b arranged on each of one side and the other side of the rear cover 4 across the center line C2.

Therefore, the peripheral wall part 32 of the holder 3 is provided with the engaging part 324 in a position corresponding to the locking part 421 on the rear cover 4-side, and as viewed from the touch panel 21-side, the locking part 421 on the rear cover 4-side and the engaging part 324 on the holder 3-side are arranged in a positional relation to overlap with each other.

As described above, the shaft 82 of the solenoid 8 moves forward/backward in the thickness direction of the display part 2 (in the upper-lower direction in FIG. 4A) by the switching of power supply/non-power supply to the coil 81.

At the non-power supply time to the coil 81, the holding force by the solenoid 8 and the urging force of the spring Sp act on the holder 3 through the abutting part 83, and the holder 3 is urged upward on the touch panel 21-side.

Therefore, the holder 3 is located in a position (in the restriction position) where the engaging part 324 disposed on the outer periphery of the bottom wall part 31 is made to be in pressure contact with the locking part 421 on the rear cover 4-side (refer to FIG. 4A).

In this state, a clearance Δt1 in the upper-lower direction is formed between the support part 323 on the holder 3-side and the locking part 421 on the rear cover 4-side, but a state where the engaging part 324 on the holder 3-side is in pressure contact with the locking part 421 on the rear cover 4-side is ensured by the holding force of the solenoid 8.

Therefore, the display part 2 supported by the holder 3 is restricted from being displaced not only in a direction away from the rear cover 4 (in an upper direction in the figure) but also in a direction approaching the rear cover 4 (in a lower direction in the figure).

That is, a relative movement between the display part 2 supported by the holder 3 and the rear cover 4 is restricted.

In addition, at the power supply time to the coil 81, the shaft 82 is pulled in downward of the rear cover 4 on the bottom wall part 41-side. Then, the holder 3 is displaced from a position where the engaging part 324 is made to be in pressure contact with the locking part 421 (refer to FIG. 4A) to a position where the engaging part 324 is made to be not in pressure contact with the locking part 421 (refer to FIG. 4B).

In this state, the clearance in the upper-lower direction between the support part 323 on the holder 3-side and the locking part 421 on the rear cover 4-side is narrowed to Δt2, and on the other hand, the clearance Δt3 is formed between the engaging part 324 on the holder 3-side and the locking part 421 on the rear cover 4-side.

Therefore, a relative movement of the display 2 supported by the holder 3 to the rear cover 4 is allowed, and the displacement of the display part 2 to the direction away from the rear cover 4 (to the upper direction in the figure) and the displacement of the display part 2 to a direction approaching the rear cover 4 (to the lower direction in the figure) are allowed.

In the display device 1, the control device 10 holds the display part 2 in the restriction position where the relative displacement to the rear cover 4 is restricted before the user operation for the touch operation of the touch panel 21 is detected.

In addition, when the user operation for the touch operation of the touch panel 21 is detected, the control device 10 drives the solenoid 8 to displace the display part 2 from the restriction position to the allowance position where the relative displacement to the rear cover 4 is allowed.

That is, the display part 2 is located in the allowance position only in a case where the user operation for the touch operation of the touch panel 21 is detected.

Figure 5:
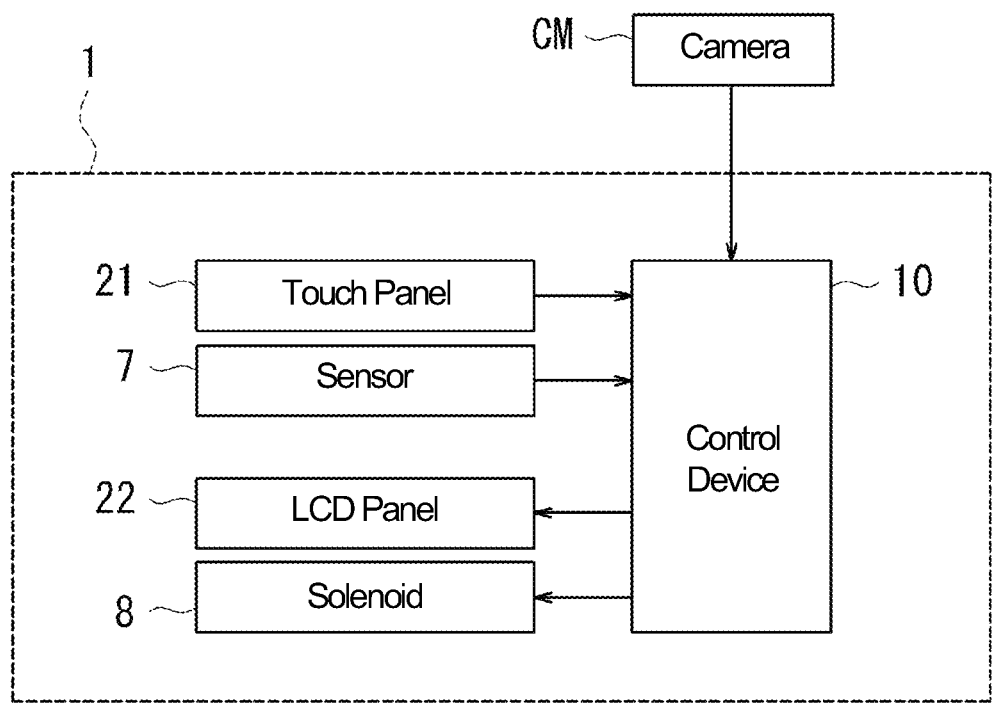
FIG. 5 is a block diagram illustrating the display device according to the embodiment.

FIG. 5 is a block diagram of the display device 1.

For example, icons for operation of in-vehicle equipment devices are displayed on the display surface 22a of the liquid crystal display panel 22 (refer to FIG. 1) by the control device 10 in the display device 1.

When a hand finger of a user touches an icon on the liquid crystal display panel 22 in the display device 1, coordinate data showing a coordinate on the touch panel 21 touched by the hand finger of the user are inputted from the touch panel 21 to the control device 10 (refer to FIG. 3A).

The control device 10 specifies the coordinate on the touch panel 21 touched by the hand finger of the user based upon the inputted coordinate data, and executes the processing assigned to the icon displayed in the specified coordinate.

For example, in a case where the touched icon is an icon for increasing display brightness of the liquid crystal display panel 22, the control device 10 increases the display brightness of the liquid crystal display panel 22.

Further, in the display device 1, a shot image around the display device 1 in the vehicle compartment is inputted from a camera CM to the control device 10. The control device 10 detects the user operation for the operation of the touch panel 21 from the inputted shot image.

It should be noted that the user operation for the operation of the touch panel 21 is detected by an outside image processing device different from the display device 1, and it may be informed that the user operation for the operation of the touch panel 21 is detected, from the image processing device.

When the user operation for the touch operation of the touch panel 21 is detected, the control device 10 drives the solenoid 8 to displace the display part 2 from the restriction position (refer to FIG. 4A) to the allowance position (refer to FIG. 4B).

Thereby, the display part 2 becomes in a state of being capable of being displaced relative to the rear cover 4, and when the touch panel 22 is operated by the user, the display part 2 is to be displaced to the bottom wall part 41-side of the rear cover 4 in accordance with an operation force.

In the display device 1, when the display part 2 is displaced by the operation of the touch panel 21, an output value of the sensor 7 for detecting the displacement of the display part 2 changes. When the displacement of the display part 2 is confirmed by the change in the output value of the sensor 7, the control device 10 drives the solenoid 8 to vibrate the display part 2.

Thereby, the user having operated the touch panel 21 can be informed through the vibration of the display part 2 that the input operation through the touch panel 21 is detected on the display device 1-side.

Figure 6:
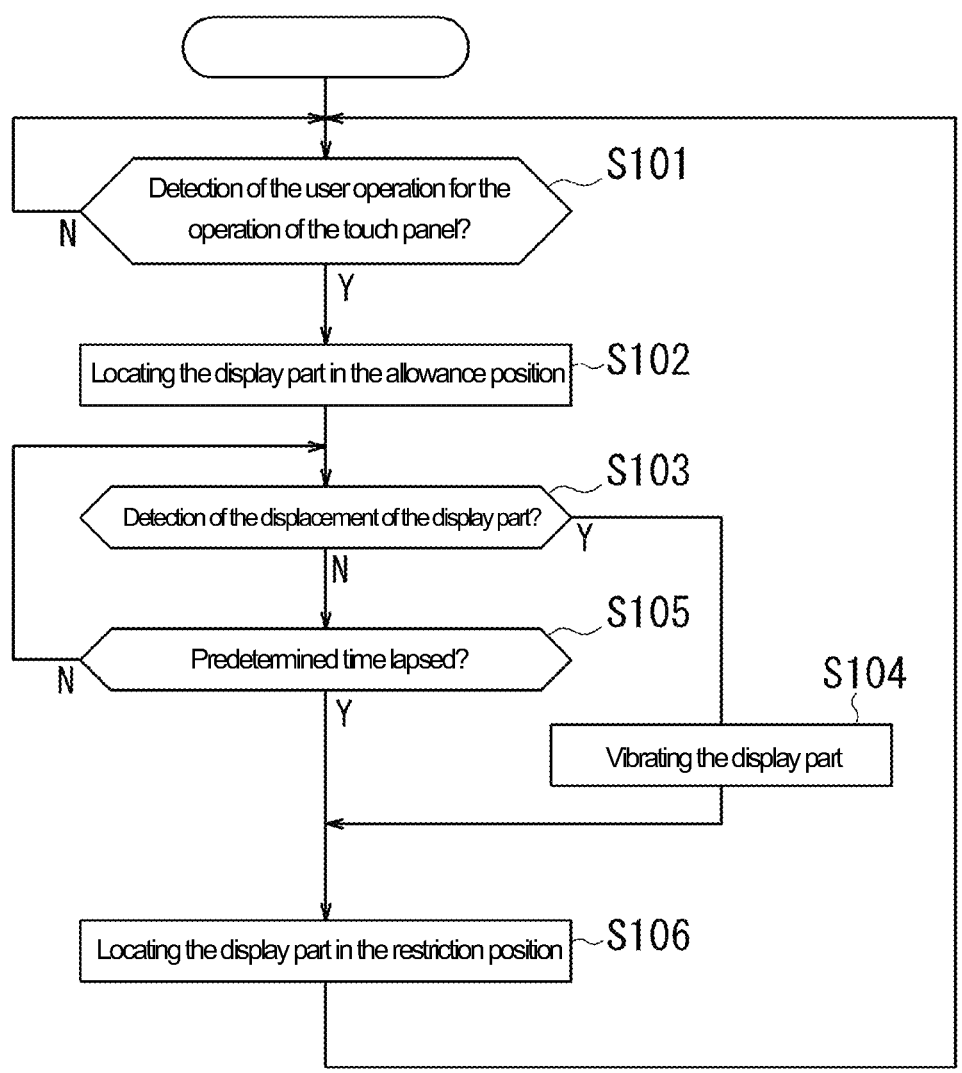
FIG. 6 is a flow chart explaining processing of a control device in the display device according to the embodiment.

FIG. 6 is a flow chart explaining the processing in the control device 10 in the display device 1.

Figure 7A:
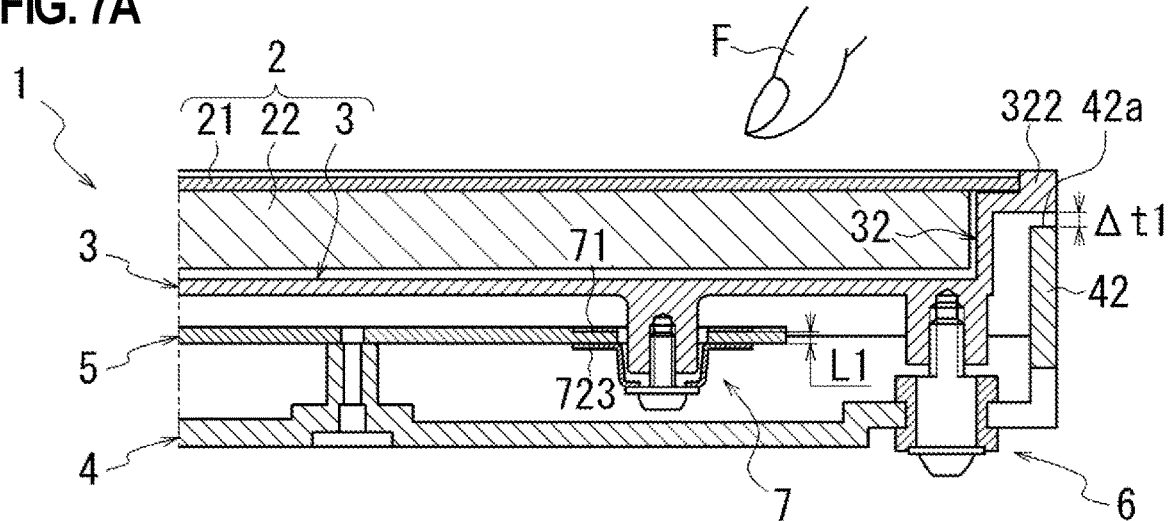
FIG. 7A is a diagram explaining an operation of the display device according to the embodiment.
Figure 7B:
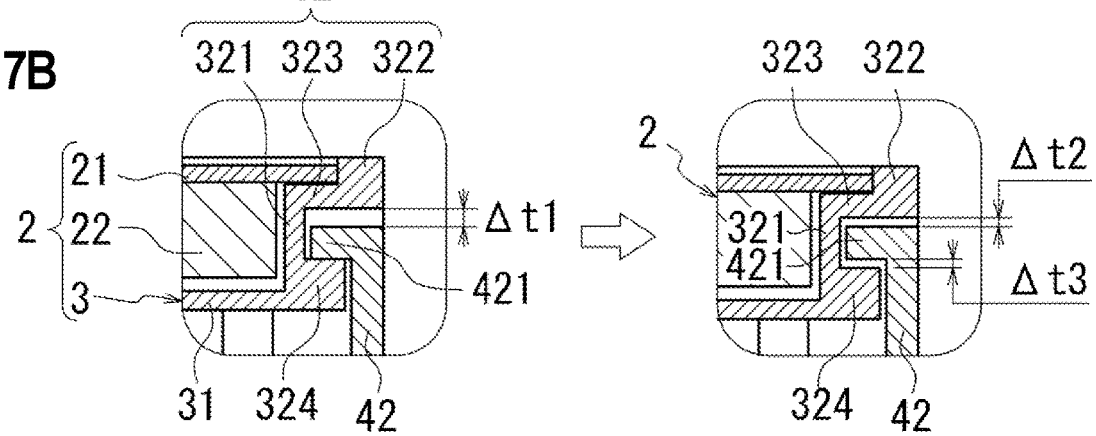
FIG. 7B is a diagram explaining an operation of the display device according to the embodiment.
Figure 7C:
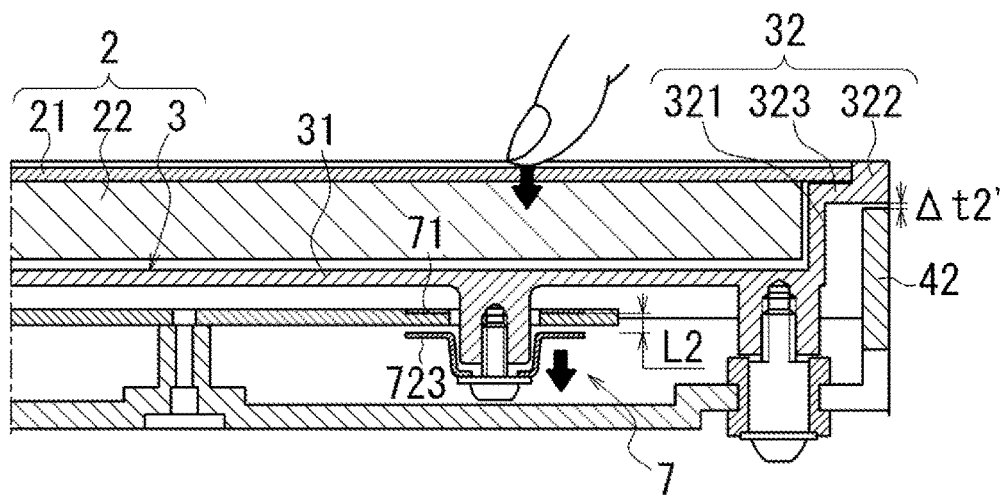
FIG. 7C is a diagram explaining an operation of the display device according to the embodiment.

FIGS. 7A, 7B and 7C are diagrams explaining the operation in the display device 1 at the operation time of the touch panel 21.

To begin with, the control device 10 confirms presence/absence of the user operation for the operation of the touch panel 21, for example, presence/absence of the operation for causing the hand finger F to be closer to the touch panel 21 (step S101).

As described above, the shot image is inputted to the control device 10 from the camera CM.

For example, when the camera CM is located to be directed to the area around the touch panel 21, it can be confirmed whether or not the user has performed the user operation for the operation of the touch panel 21 by executing the conventionally known image processing to the shot image to be inputted from the camera CM.

In a case where the user performs the user operation for the operation of the touch panel 21 (Yes in step S101), the control device 10 drives the solenoid 8 to displace the display part 2 from the restriction position (refer to FIG. 4A) to the allowance position (refer to FIG. 4B).

In the display part 2 located in the restriction position, the clearance Δt1 in the upper-lower direction is formed between the support part 323 on the holder 3-side and the locking part 421 on the rear cover 4-side, but the state where the engaging part 324 on the holder 3-side is in pressure contact with the locking part 421 on the rear cover 4-side is ensured by the holding force of the solenoid 8. Therefore, the relative displacement of the display part 2 to the rear cover 4 is restricted (refer to FIG. 7B).

When the display part 2 is located in the allowance position, the clearance between the support part 323 on the holder 3-side and the locking part 421 on the rear cover 4-side is narrowed to Δt2, and on the other hand, the clearance Δt3 is formed between the engaging part 324 on the holder 3-side and the locking part 421 on the rear cover 4-side (refer to FIG. 7B).

Therefore, the relative movement of the display part 2 supported by the holder 3 to the rear cover 4 is allowed, and the relative displacement of the display part 2 to the rear cover 4 is allowed.

When the display part 2 is pushed by the hand finger F of a user in this state, the display part 2 is to be displaced to the rear cover 4-side (refer to FIG. 7C).

Therefore, the control device 10 locates the display part 2 in the allowance position (step S102), and after that, confirms whether or not the display part 2 is displaced (step S103).

In the display device 1, the spacer 72 (the flange part 723) of the sensor 7 is displaced in the direction away from the print board 5 by the displacement of the display part 2 to the rear cover 4-side (refer to FIG. 3A).

Thereby, at a point when a separation distance between the antenna 71 of the sensor 7 and the flange part 723 increases from an initial state L1 to L2, the control device 10 determines that the display part 2 is displaced (S103).

At this point, the clearance between the support part 323 on the holder 3-side and the peripheral wall part 42 on the rear cover 4-side is narrowed to Δt2'.

When the display part 2 is confirmed to be displaced (Yes in step S103), the control device 10 drives the solenoid 8 to vibrate the display part 2 (step S104). At the same time, in a state where the touched icon is an icon for increasing the display brightness of the liquid crystal display panel 22, the control device 10 increases the display brightness of the liquid crystal display panel 22.

Thereby, the user is informed that the operation of the touch panel 21 is inputted into the display device 1, as the vibration.

In addition, the control device 10 drives the solenoid 8 to displace the display part 2 from the allowance position (refer to FIG. 4B) to the restriction position (refer to FIG. 4A) (step S106).

As a result, the display part 2 becomes in a state where the relative displacement to the rear cover 4 is restricted.

Accordingly, the display part 2 is held in a state where the relative displacement to the rear cover 4 is restricted until the user operation for the operation of the touch panel 21 is newly detected.

It should be noted that even in a case where the displacement of the display part 2 is not confirmed (No in step S103) until a predetermined time elapses after the display part 2 is located in the allowance position (step S102), the process in step S106 is executed.

Thereby, even though the user operation for the operation of the touch panel 21 is detected, in a case where the touch panel 21 is not operated, the display part 2 is not held in a state of being located in the allowance position.

In this way, the display part 2 is located in the restriction position until the user operation for the operation of the touch panel 21 is detected, thus restricting the displacement of the display part 2. In addition, the display part 2 is located in the allowance position only for a predetermined period after the user operation for the operation of the touch panel 21 is detected, thus allowing the displacement of the display part 2.

Accordingly, the detection of presence/absence in the displacement of the display part 2 caused by the operation of the touch panel 21 is appropriately performed, making it possible to vibrate the display part 2 as needed.

Thereby, it is possible to make the sensor 7 as a component susceptible to the vibration in the display device 1 difficult to be affected by the vibration.

As described above, the display device 1 according to the present embodiment has the configuration as follows.

(1) The display device 1 comprises:

the display part 2 with the touch panel 21 (the operation surface) on which a touch operation is performed by a user;

the sensor 7 that detects a displacement of the display part 2 by the touch operation of the touch panel 21;

the solenoid 8 (the actuator) that vibrates the display part 2; and the control device 10 configured to control the solenoid 8.

The display device 1 is a display device of a force feedback type configured in such a way that the control device 10 vibrates the display part 2 by the solenoid 8 when the displacement of the display part 2 is detected, thereby informing the user having operated the touch panel 21 that the operation of the touch panel 21 is detected.

The display part 2 is displaceable between the restriction position (FIG. 4A) for restricting the displacement thereof and the allowance position (FIG. 4B) for allowing the displacement thereof, by the solenoid 8.

The control device 10 holds the display part 2 in the restriction position, and locates the display part 2 in the allowance position when the user operation for the touch operation of the touch panel 21 is detected, thus causing the display part 2 to be in a state of being capable of vibrating.

With this configuration, the vibration of the display part 2 is restricted until the user operation for the touch operation of the touch panel 21 is detected. As a result, it is possible to make the sensor 7 as a component susceptible to the vibration in the display device 1 difficult to be affected by the vibration due to travel of a vehicle with the display device 1 or the like.

The display device 1 according to the present embodiment has the configuration as follows.

(2) In a front view from the touch panel 21-side (the operation face side), the solenoid 8 is located on the back of the display part 2 in the thickness direction.

The solenoid 8 supports the back of the display part 2 at the central area and vibrates the display part 2 in the thickness direction of the display part 2.

With this configuration, the displacement of the display part 2 can be performed by the single solenoid 8. In a case of needing a plurality of actuators for the drive of the display part 2, an increase on the number of components causes a manufacturing cost of the display device 1 to increase.

The displacement of the display part 2 is performed by the single solenoid 8 supporting the back of the display part 2 at the central area, thereby making it possible to suppress the increase on the manufacturing cost of the display device 1.

The display device 1 according to the present embodiment has the configuration as follows.

(3) The display part 2 located in the restriction position is held in a state of being pushed against the locking part 421 (the locking part) on the rear cover 4 (the fixing-side member)-side by the holding force of the solenoid 8.

With this configuration, since the solenoid 8 vibrating the display part 2 can be diverted for the displacement restriction of the display part 2, there is no need of preparing for the solenoid for vibrating the display part 2 and the actuator for restricting the displacement of the display part 2 separately. As a result, it is possible to suppress an increase on the manufacturing cost of the display device 1 while preventing an increase in size of the display device 1.

The display device 1 according to the present embodiment has the configuration as follows.

(4) The solenoid 8 is supported by the bottom wall part 41 of the rear cover 4 accommodating the display part 2.

The locking part 421 is disposed on the inner periphery of the peripheral wall part 42 surrounding the outer peripheral edge of the bottom wall part 41. The display part 2 located in the allowance position is supported by the rear cover 4 through the solenoid 8.

The display part 2 located in the restriction position is supported by the rear cover 4 through the solenoid 8 and the locking part 421.

With this configuration, since the display part 2 located in the allowance position is supported only through the solenoid 8 by the rear cover 4, the display part 2 can quickly be displaced in association with the operation of the touch panel by the user.

In addition, the display part 2 located in the restriction position is supported by the rear cover 4 through the solenoid 8 and the locking part 421, and the relative displacement of the display part 2 to the rear cover 4 is restricted. Therefore, at the traveling of the vehicle with the display device 1, it is possible to appropriately prevent the vibration due to the travel from successively acting on the display part 2.

The display device 1 according to the present embodiment has the configuration as follows.

(5) In a front view from the touch panel 21-side, the display part 2 is provided with the engaging part 324 on each of the one lateral edge part and the other lateral edge part thereof across the central area.

The display part 2 located in the restriction position is held by the holding force of the solenoid 8 in a state where the engaging part 324 is pushed against the locking part 421 of the rear cover 4 (the fixing-side member).

With this configuration, the displacement of the display part 2 can be performed between the restriction position and the allowance position by displacing the display part 2 by the solenoid 8 in the same direction with the displacement direction (in the thickness direction of the display part) at the time of vibrating the display part 2.

The display device 1 according to the present embodiment as follows.

(6) The display device 1 is provided with the camera CM for shooting a user.

The control device 10 determines presence/absence of the user operation for the touch operation of the touch panel 21 from the shot image of the camera CM.

With this configuration, it is possible to appropriately determine the presence/absence of the user operation for the touch operation of the touch panel 21.

In addition, for example, by determining the presence/absence of the user operation for the operation of the touch panel 21 by using the shot image of the camera monitoring a passenger, it is not necessary to prepare for a camera for determination of the user operation separately.

Thereby, an increase on the manufacturing cost of the display device 1 can be prevented appropriately.

The display device 1 according to the present embodiment has the configuration as follows.

(7) The sensor 7 is provided with the antenna 71 (the fixed part) supported by the print board 5 on the rear cover 4 (the fixing-side member)-side, and the spacer 72 (the flange part 723: the movable part) that is displaced together with the display part 2 and changes in a distance to the antenna 71.

The sensor 7 detects the displacement of the display part 2 by the operation of the touch panel 21 based upon the change in the distance between the antenna 71 and the flange part 723.

For example, in a case where the display device 1 is mounted in the vehicle, the vibration (the outside vibration) due to the travel of the vehicle acts on the display device 1. Here, when the displacement of the display part 2 is not restricted, an external force due to the outside vibration is inputted to the display part. Then, the external force acts also on the sensor 7 as the component susceptible to the vibration in the display device 1.

Here, since the sensor 7 has the two components (the antenna 71 and the spacer 72) moving relatively, when the two components continues to move relatively by the vibration continuously inputted, in some cases the detection by the sensor 7 is affected.

With the configuration as described above, when there is no need of detecting the displacement of the display part 2, it is possible to restrict the relative movement of the two components configuring the sensor 7. Thereby, since it is possible to prevent the two components from relatively moving by the continuously inputted vibration, the detection by the sensor 7 is made difficult to be affected by the vibration.

The display device 1 according to the present embodiment has the configuration as described above.

(8) In a front view illustrating the display part 2 as viewed from the touch panel 21-side, the display part 2 formed in the rectangular shape is supported on the bottom wall part 41 of the rear cover 4 as the fixing-side member through the shock absorbers 6 arranged on the four corners.

In the display device 1 the shock absorber 6 is disposed in each of the four areas 1 to 4 defined by the two center lines C1, C2.

The display part 2 supported by the shock absorbers 6 can be displaced in the thickness direction of the display 2, and the vibration of the display part 2 due to the displacement thereof in the thickness direction is damped by the shock absorbers 6.

With this configuration, the vibration of the display part 2 is absorbed by the portions of the shock absorbers 6. As a result, it is possible to suppress the vibration that will act on the sensor 7 as the component susceptible to the vibration in the display device 1.

[Modification]

In the above-mentioned embodiment, there is exemplified a case where the presence/absence of the user operation for the operation of the touch panel 21 is determined by the shot image of the camera CM.

A method for determining the presence/absence of the user operation for the operation of the touch panel 21 is not limited to this method.

For example, in a case where the touch panel is a touch panel of a type detecting a change in an electrostatic capacitance, the touch panel 21 may determine the presence/absence of the user operation for the operation of the touch panel 21.

For example, in a case of being capable of switching detection sensitivity of the touch panel 21, the following may be adopted.

The control device 10 switches the detection sensitivity of the touch panel 21 between a first detection sensitivity for detection of an approach of a hand finger of a user to the touch panel 21 and a second detection sensitivity, which is lower than the first detection sensitivity, for being capable of detection of the touch operation of the touch panel 21.

The control device 10 sets the detection sensitivity of the touch panel 21 to the first detection sensitivity when the display part 2 is located in the restriction position, and changes the detection sensitivity of the touch panel 21 from the first detection sensitivity to the second detection sensitivity when the approach of the hand finger of the user to the touch panel 21 is detected.

Thereby, the control device 10 displaces the display part 2 from the restriction position to the allowance position at a point when the approach of the hand finger of the user to the touch panel 21 is detected, whereby the touch operation after that can be appropriately detected.

In this way, the display device 1 according to the modification has the configuration as follows.

(9) The detection sensitivity of the touch panel 21 can be switched between the first detection sensitivity for detection of the approach of the hand finger of the user to the touch panel 21 and the second detection sensitivity, which is lower than the first detection sensitivity, for being capable of detection of the touch operation of the touch panel 21.

The control device 10 sets the detection sensitivity of the touch panel 21 to the first detection sensitivity when the display part 2 is located in the restriction position. When the approach of the hand finger of the user to the touch panel 21 is detected, the detection sensitivity of the touch panel 21 is changed from the first detection sensitivity to the second detection sensitivity. Further, the display part 2 is displaced from the restriction position to the allowance position.

Also with this configuration, the presence/absence of the user operation for the operation of the touch panel 21 can be appropriately determined.

In addition, the vibration of the display part 2 is restricted until the user operation for the touch operation of the touch panel 21 is detected. Thereby, the sensor 7 as a component susceptible to the vibration in the display device 1 is made difficult to be affected by the vibration due to the travel of the vehicle on which the display device 1 is mounted.

[Modification 2]

Figure 8:
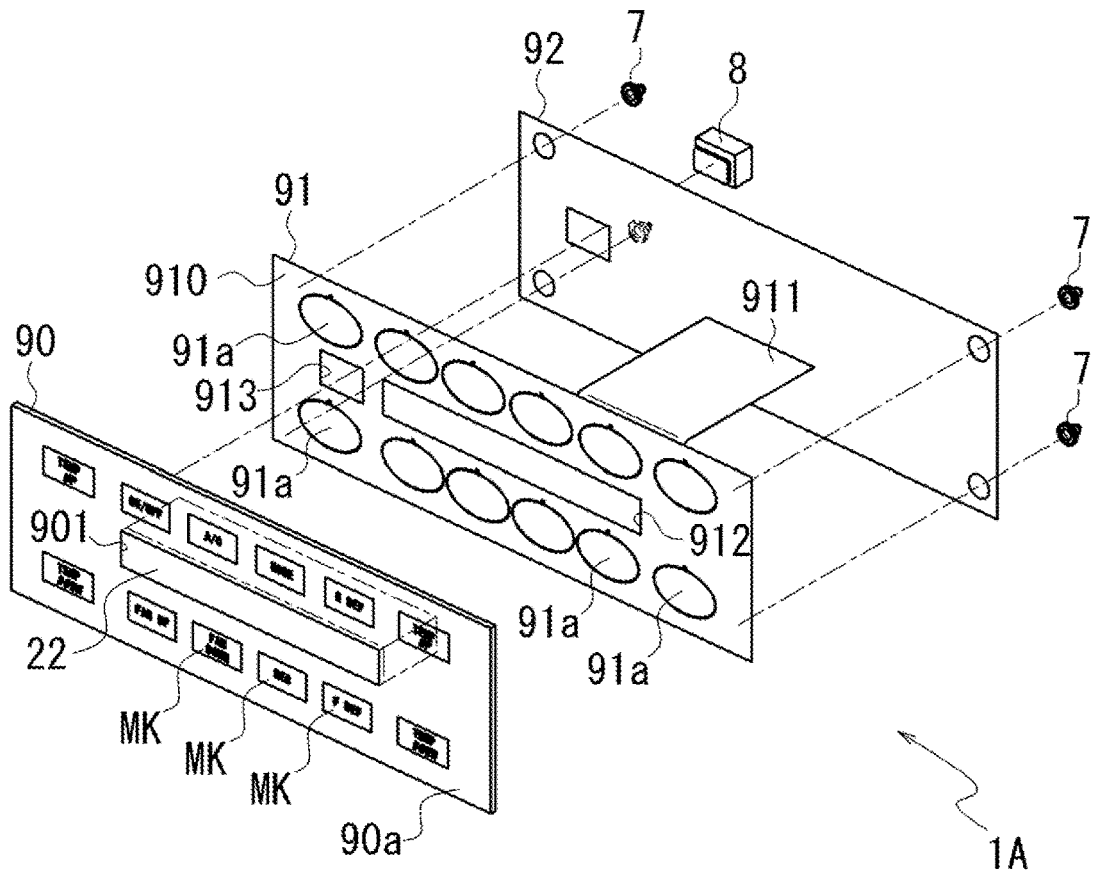
FIG. 8 is a diagram explaining a display device according to a modification in the present invention.

FIG. 8 is an exploded perspective view of a display device 1A according to another modification.

Figure 9:
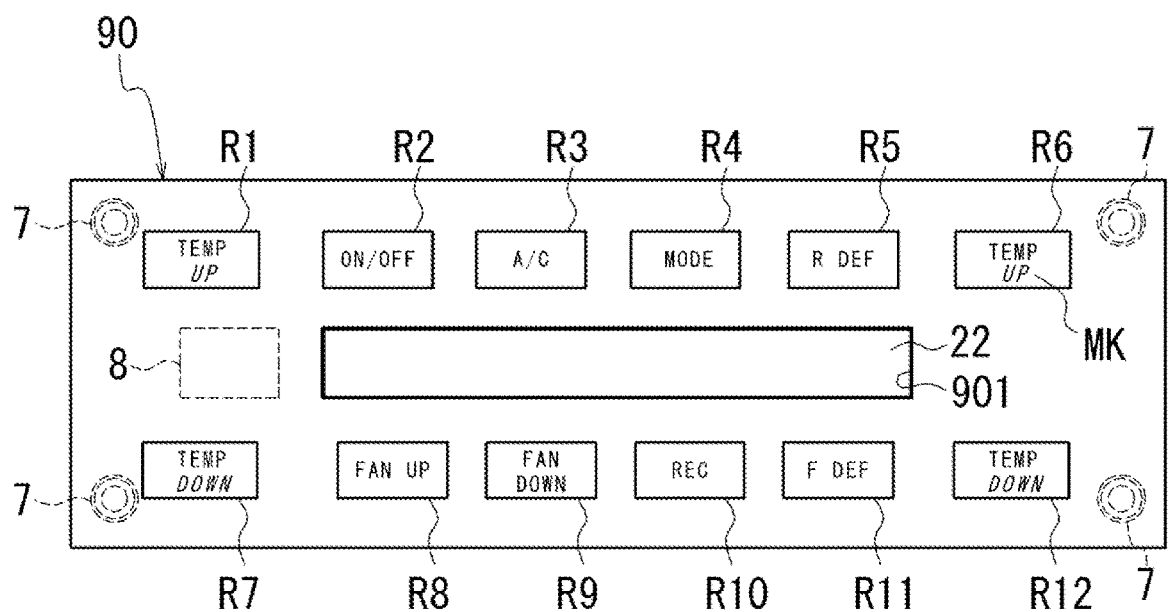
FIG. 9 is a diagram explaining the display device according to the modification in the present invention.

FIG. 9 is a front view of a decorative panel 90 of the display device 1A according to the other modification.

In the above-mentioned embodiment, there is exemplified a case where the operation surface on which the touch operation is performed by a user is the touch panel 21.

The present invention is also applicable to the display device 1A configured to detect the touch operation of the user by using a film electrode 91, for example.

As illustrated in FIG. 8 and FIG. 9, the display device 1A is provided with the decorative panel 90 on a surface (on an operation surface) 90*a* of which a plurality of icons MK are printed. The decorative panel 90 is installed in a position operable by a user on an instrument panel in the vehicle compartment, for example.

The decorative panel 90 is supported through unillustrated shock absorbers on the unillustrated rear cover, and in this state, the decorative panel 90 is supported to be displaceable in the thickness direction of the decorative panel 90 (in the same way as the above-mentioned embodiment).

The decorative panel 90 is formed of a non-conductive material, and the film electrode 91 for detecting the touch operation and a print board 92 are positioned on the back of the decorative panel 90.

It should be noted that since other components in the display device 1A are identical to those in the above-mentioned display device 1, the explanation is herein omitted.

An opening part 901 is disposed in the central part of the decorative panel 90 for the fitting of the liquid crystal display panel 22.

A plurality of operation areas to which optional functions are allotted are arranged on the surface of the decorative panel 90 (the operation areas R1 to R12: refer to FIG. 9). In the decorative panel 90, the operation areas R1 to R12 each are set to have a predetermined area, and the thickness of each of the operation areas R1 to R12 is set to be thinner than the other areas.

Therefore, the operation areas R1 to R12 are displaceable in a direction facing the film electrode 91 (in the thickness direction of the decorative panel 90), and when any of the operation areas R1 to R12 is touched by a user, the touched operation area is displaced to be in a direction closer to the film electrode 91.

Each of the operation areas R1 to R12 is provided on the print board 92-side with the film electrode 91. The film electrode 91 is configured of a flexible FPC (Flexible Printed Circuits), and includes a base film 910, and a terminal part 911 extending to the print board 92 from the base film 910.

A plurality of transparent or semitransparent electrodes 91a are arranged on a surface of the base film 910 on the decorative panel 90-side. The plurality of electrodes 91a are respectively arranged on the operation areas R1 to R12 of the decorative panel 90 on a one-to-one basis. The plurality of electrodes 91a and the plurality of operation areas R1 to R12 face to each other to be spaced in the thickness direction of the decorative panel 90.

In the display device 1A, when any of the operation areas is touched, the touched operation area is displaced to the film electrode 91-side to change the positional relation between the operation area and the electrode 91a. The change in the positional relation between the operation area and the electrode 91a can be detected as a change in an electrostatic capacitance of the electrode 91a.

The control device 10 in the display device 1A confirms the presence/absence of the touch operation in the operation area to which each of the electrodes 91a corresponds, based upon the presence/absence of the change in the electrostatic capacitance of each of the electrodes 91a.

As illustrated in FIG. 8 and FIG. 9, in a plan view the sensors 7 are respectively arranged on the four corners of the print board 92 in the display device 1A. The sensor 7 is a sensor with the same configuration and role as those of the sensor 7 in the above-mentioned display device 1.

The sensor 7 is disposed for detecting the displacement of the decorative panel 90 following the touch operation of the operation area in the decorative panel 90.

Further, in the decorative panel 90, the solenoid 8 abuts on the back of the decorative panel 90 corresponding to an area between the operation area R1 and the operation area R7. The solenoid 8 also is a sensor with the same configuration and role as those of the sensor 7 in the above-mentioned display device 1 and is driven by the control device 10 provided in the display device 1.

The solenoid 8 displaces the decorative panel 90 between the allowance position for allowing the vibration of the decorative panel 90 and the restriction position for restricting the vibration and vibrates the decorative panel 90 when the touch operation on the operation area is confirmed.

Also in the display device 1A with this configuration the vibration of the decorative panel 90 is restricted until the user operation for the operation of the touch panel 21 is detected. As a result, the sensor 7 as the component susceptible to the vibration in the display device 1A is made difficult to be affected by the vibration.

As described above, the display device 1A according to the modification has the configuration as follows.

(10) The display device 1A comprises:

the decorative panel 90 on which a touch operation is performed by a user and on an operation surface of which the plurality of operation areas R1 to R12 are arranged;

the film electrode 91 (the electrode sheet) including the plurality of electrodes 91a that are arranged to face the operation areas R1 to R12 respectively on a one-to-one basis;

the sensor 7 that detects the displacement of the decorative panel 90 by the touch operation of the user;

the solenoid 8 (the actuator) that vibrates the decorative panel 90; and the control device 10 configured to control the solenoid 8.

The display device 1A is a display device of a force feedback type configured in such a way that the control device 10 vibrates the decorative panel 90 by the solenoid 8 when the displacement of the decorative panel 90 is detected, thereby informing the user having operated the operation area in the decorative panel 90 that the operation of the operation area is detected.

The decorative panel 90 is displaceable between the restriction position for restricting the displacement thereof and the allowance position for allowing the displacement thereof, by the solenoid 8.

The control device 10 holds the decorative panel 90 in the restriction position, and displaces the decorative panel 90 from the restriction position to the allowance position when the user operation for the operation of the decorative panel 90 is detected.

Also with this configuration, it is possible to appropriately prevent the vibration from affecting the sensor 7 or the like as the component susceptible to the vibration in the display device 1.

While only the selected embodiment and the modification examples have been chosen to illustrate the present invention, it will be apparent to those skilled in the art from this disclosure that various changes and modifications can be made therein without departing from the scope of the invention as defined in the appended claims. Furthermore, the foregoing description of the embodiment and the modification examples according to the present invention is provided for illustration only, and not for the purpose of limiting the invention as defined by the appended claims and their equivalents.

What is claimed is:

1. A display device, comprising:
 a display part including an operation surface on which a touch operation is performed by a user;
 a sensor structured and arranged to detect a displacement of the display part by the touch operation;
 an actuator configured to vibrate the display part; and
 a control device configured to control the actuator, the control device further configured to vibrate the display part with the actuator when the displacement of the display part by the touch operation is detected;
 wherein the display part is displaceable between a restriction position for restricting the displacement of the display part via the actuator and an allowance position for allowing the displacement of the display part via the actuator;
 wherein the control device is further configured to hold the display part in the restriction position and adjust the display part into the allowance position when a user operation for the touch operation is detected;
 wherein, in a front view of the display part from an operation surface side, the actuator supports a back of the display part and vibrates the display part in a thickness direction of the display part; and
 wherein the display part, when disposed in the restriction position, is pushed against a locking part in a fixing-side member via a holding force of the actuator.

2. The display device according to claim 1, further comprising a camera structured and arranged to shoot an image of a user, wherein the control device is further configured to detect the user operation for the touch operation from a shot image of the camera.

3. The display device according to claim 1, wherein:
the operation surface includes a touch panel covering a surface of the display part;
a detection sensitivity of the touch panel is switchable between a first detection sensitivity for detection of an approach of a hand finger of the user to the touch panel and a second detection sensitivity, which is lower than the first detection sensitivity, for detection of the touch operation of the touch panel; and
the control device is further configured to:
set the detection sensitivity of the touch panel to the first detection sensitivity when the display part is located in the restriction position; and
change the detection sensitivity of the touch panel from the first detection sensitivity to the second detection sensitivity when the user operation for the touch operation is detected.

4. The display device according to claim 1, further comprising an electrode sheet, wherein:
the operation surface includes a non-conductive panel having a plurality of operation areas; and
the electrode sheet includes a plurality of electrodes arranged to face the plurality of operation areas respectively on a one-to-one basis.

5. The display device according to claim 3, wherein:
in a front view of the display part from an operation surface side, the display part has a first lateral edge part and a second lateral edge part disposed across a central area of the display part from the first lateral edge part;
the first lateral edge part and the second lateral edge part each include an engaging part; and
the display part, when disposed in the restriction position, the engaging part is pushed against the locking part of the fixing-side member via the holding force of the actuator.

6. The display device according to claim 3, wherein:
the sensor includes a fixed part supported on a fixing-side member side, and a movable part that is displaceable together with the display part such that a distance between the fixed part and the movable part changes; and
the sensor detects a displacement of the display part by the touch operation based upon a change in the distance between the fixed part and the movable part.

* * * * *